(12) United States Patent
Tzartzanis et al.

(10) Patent No.: US 7,075,842 B2
(45) Date of Patent: Jul. 11, 2006

(54) DIFFERENTIAL CURRENT-MODE SENSING METHODS AND APPARATUSES FOR MEMORIES

(75) Inventors: Nestor Tzartzanis, Belmont, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/779,464

(22) Filed: Feb. 13, 2004

(65) Prior Publication Data

US 2005/0180224 A1   Aug. 18, 2005

(51) Int. Cl.
*G11C 7/00* (2006.01)
(52) U.S. Cl. .................... 365/205; 365/207; 365/210; 365/185.2
(58) Field of Classification Search ............. 365/205, 365/207, 210, 185.2, 185.21
See application file for complete search history.

(56) References Cited

U.S. PATENT DOCUMENTS

| 6,847,555 B1 * | 1/2005 | Toda ............... 365/185.21 |
| 2002/0021605 A1 * | 2/2002 | Harada et al. ........ 365/201 |

OTHER PUBLICATIONS

R. Foss, R. Harland, "Peripheral Circuits for One-Transistor Cell MOS RAM's", IEEE Journal of Solid-State Circuits, vol. SC-10, No. 5, Oct. 1975.

N. Lu, H. Chao, "Half-$V_{dd}$ Bit-Line Sensing Scheme in CMOS DRAM's" IEEE Journal of Solid-State Circuits, vol. SC-19, No. 4, Aug. 1984.

S. Dhong, N. Lu, W. Hwang, S. Parke, "High-Speed Sensing Scheme for CMOS DRAM's", IEEE Journal of Solid-State Circuits, vol. 23, No. 1, Feb. 1988.

S. Shinagawa, et al., "A Multi-Speed Digital Cross-Connect Switching VLSI Using New Circuit Techniques in Dual Port RAMs," IEEE Custom-Integrated Circuits Conference, 1991.

T. Blalock, R. Jaeger, "A High-Speed Clamped Bit-Line Current-Mode Sense Amplifier," IEEE Journal of Solid-State Circuits, vol. 26, No. 4, Apr. 1991.

Seevinck, P. van Beers, H. Ontrop, "Current-Mode Techniques for High-Speed VLSI Circuits with Application to Current Sense Amplifier for CMOS SRAM's," IEEE Journal of Solid-State Circuits, vol. 26, No. 4, Apr. 1991.

(Continued)

*Primary Examiner*—Huan Hoang
(74) *Attorney, Agent, or Firm*—Sheppard Mullin Richter & Hampton LLP

(57) ABSTRACT

Disclosed is a memory architecture where current sense amplifiers are used instead of voltage sense amplifiers, and where the memory cells normally disposed along a single bit line are divided between two half bit lines. Each half bit line is coupled to a respective input of the current sense amplifier. When one of the memory cells is selected for reading, it couples a current related to its stored data state to the half bit line that it is coupled to. During this operation, a reference current is generated on the other half bit line. Also disclosed are novel current sense amplifiers.

40 Claims, 5 Drawing Sheets

OTHER PUBLICATIONS

T. Blalock, R. Jaeger, "A High-Speed Sensing Scheme for IT Dynamic RAM's Utilizing the Clamped Bit-Line Sense Amplifier," IEEE Journal of Solid-State Circuits, vol. 27, No. 4, Apr. 1992.

M. Izumikawa, M. Yamashina, "A Current Direction Sense Technique for Multiport SRAM's," IEEE Journal of Solid-State Circuits, vol. 31, No. 4, Apr. 1996.

N. Tzartzanis, W. Athas, "Clock-Powered Logic for a 50MHz Low-Power RISC Datapath," IEEE ISSCC Digest of Technical Papers, pp. 338-339, San Francisco, CA, Feb. 6-8, 1997.

W. Athas, et al., "A Low-Power Microprocessor Based on Resonant Energy," IEEE Journal of Solid-State Circuits, vol. 32, No. 11, Nov. 1997.

B. Amrutur, M. Horowitz, "A Replica Technique for Wordline and Sense Control in Low-Power SRAM's," IEEE Journal of Solid-State Circuits, vol. 33, No. 8, Aug. 1998.

W. Athas, et al., "WA 17.5 Clock-Powered CMOS VLSI Graphics Processor for Embedded Display Controller Application," IEEE International Solid-State Circuits Conf., Feb. 2000.

N. Tzartzanis, W. Athas, L. Svensson, "A Low-Power SRAM with Resonantly Powered Data, Address, Word, and Bit Lines," Proceedings of the 2000 European Solid-State Circuits Conference (ESSCIRC'2000), Sep. 19-21, 2000, Stockholm, pp. 336-339.

Y. Takao, et al., "A 0.1 µm CMOS Technology with Copper and Very-low-k Interconnects for High-Performance System-On-a Chip Cores," International Electron Devices Meeting, pp. 559-562, San Francisco, CA, Oct. 10-13, 2000.

W. Athas, et al., "The Design and Implementation of a Low-Power Clock-Powered Microprocessor," IEEE Journal of Solid-State Circuits, vol. 35, No. 11, Nov. 2000.

N. Tzartzanis, W. Walker, H. Nguyen, A. Inoue, "A 34 Word 64 Bit 10R/6W Write-Through Self-Timed Dual-Supply-Voltage Register File," ISSCC Digest of Technical Papers, San Francisco, CA, Feb. 4-6, 2002.

R. Riedlinger, T. Grutkowski, "The High-Bandwidth 256kB 2nd Level Cache on an Itanium Microprocessor," ISSCC Digest of Technical Papers, San Francisco, CA, Feb. 4-6, 2002.

D. Bradley, P. Mahoney, B. Stackhouse, "THe 16kB Single-Cycle Read Access Cache on a Next-Generation 64b Itanium Microprocessor," IEEE ISSCC Digest of Technical Papers, San Francisco, CA, Feb. 4-6, 2002.

S. Tang, et al., "A Leakage-Tolerant Dynamic Register File Using Leakage Bypass with Stack Forcing (LBFS) and Source Follower NMOS (SFN) Techniques,"Symposium on VLSI Circuits Digest of Technical Papers, Honolulu, HI, Jun. 13-15, 2002.

S. Hsu, et al., "A 90nm 6.5GHz 256x64b Dual Supply Register File with Split Decoder Scheme", Symposium on VLSI Circuits, Jun. 2003.

* cited by examiner

DIFFERENTIAL CURRENT-MODE SENSING METHODS AND APPARATUSES FOR MEMORIES

FIELD OF THE INVENTION

The present invention relates to methods and apparatuses for sensing the state of digital data stored in electronic memories.

BACKGROUND OF THE INVENTION

The semiconductor transistors used to construct electronic memory devices are becoming progressively smaller, with the minimum channel width and channel lengths of the devices decreasing in value. This progression allows memory devices to become smaller, but the smaller channel lengths of the transistors have created more sub-threshold leakage current in the devices, particularly in CMOS devices. As is known in the art, sub-threshold current is the amount of current that leaks through the channel of the device, from source terminal to drain terminal along the channel length, when the transistor is placed in the "OFF" state ($V_{GS} < V_t$, the threshold voltage). Because of certain three-dimensional effects in the device, notably the fringing of electric fields in the device during sub-threshold conditions, the leakage current increases as the channel length decreases even if the channel width decreases at the same rate. Furthermore, decreasing the channel width at a faster rate than the channel length does not rectify the problem. These problems are particularly evident in CMOS processes.

A typical semiconductor memory comprises tens to hundreds of bit lines, with each bit line receiving the outputs of tens to hundreds of memory cells. During each memory reading operation, one memory cell in the bit line is activated to couple its data state to the bit line for reading. All of the other memory cells in the bit line are deactivated. The selective coupling of the data is achieved by a transistor in each memory cell that is turned "ON" to couple the data to the bit line, or is turned "OFF" to not couple the data. With the above-noted leakage-current problem becoming more prevalent, the collective leakage current of all of the "OFF" transistors can swamp the data that the "ON" transistor is trying to couple to the bit line. As a practical matter, this places an upper limit on the number of memory cells that can be associated with each bit line. Thus, as the size of the transistors shrinks, to increase the size of the memory and/or to increase the speed performance of the memory, one has to find a way of somehow partitioning the bit line into several local bit lines that feed a global bit line. For register file memories, which are small memories having very high-speed performance, partitioning the bit line into several local bit lines which feed a global bit line would have the negative effects of decreasing speed performance and increasing size.

Thus, there is a need to overcome this apparent fundamental limitation in order to continue receiving the benefits of increased speed and reduced size that come from reducing the size of the transistors in the memories.

SUMMARY OF THE INVENTION

In making their invention, the inventors have recognized that the fundamental problem stems from the use of memory topologies that rely on sensing a change in the voltage on the bit lines to detect the data held by the selected memory cell. As an example, during a read operation in a typical SRAM memory, both true and complement bit lines are used, with one bit line being partially discharged from a pull-down transistor of the accessed memory cell while the other bit line remains charged. A voltage-based sense amplifier is then used to amplify the small voltage difference between the two bit lines. The inventors have recognized that this conventional approach is susceptible to the above-described sub-threshold currents of the other cells attached to the bit lines, resulting in a reduction of the differential voltage available for sensing.

Broadly stated, one invention of the present application is a memory architecture where current sense amplifiers are used instead of voltage sense amplifiers, and where the memory cells normally disposed along a single bit line are divided between two half bit lines. Each half bit line is coupled to a respective input of the current sense amplifier. When one of the memory cells is selected for reading, it couples a current related to its stored data state to the half bit line that it is coupled to. During this operation, a reference current is generated on the other half bit line.

An exemplary memory device according to the present invention comprises a first plurality of memory cells and a second plurality of memory cells, with each memory cell having a read-select input and a read output. Each memory cell of the first plurality generates a current at its read output that is representative of a data value stored by the cell when the read-select input of the memory cell is activated, the current being less than or equal to a maximum magnitude $I_{M1}$. Similarly, each memory cell of the second plurality generates a current at its read output that is representative of a data value stored by the cell when the read-select input of the memory cell is activated, the current being less than or equal to a maximum magnitude $I_{M2}$. The Exemplary memory device further comprises a first bit line coupled to the read outputs of the first plurality of memory cells and a second bit line coupled to the read outputs of the second plurality of memory cells. Included is a first reference current circuit having an enable input and an output, the output being coupled to the second bit line. The first reference current circuit generates a first reference current $I_{R1}$ at its output when its enable input is activated, the first reference current $I_{R1}$ having a magnitude that is less than $I_{M1}$. The exemplary memory device also includes a second reference current circuit having an enable input and an output, the output being coupled to the first bit line. The second reference current circuit generates a second reference current $I_{R2}$ at its output when its input is activated, the second reference current $I_{R2}$ having a magnitude that is less than $I_{M2}$. The exemplary memory device further comprises a current sense amplifier having a first input coupled to the first bit line, a second input coupled to the second bit line, and an output generating a signal representative of the difference in currents presented at the inputs of the differential current sense amplifier. The sense amplifier may be of any conventional design.

In conjunction with developing the above memory architecture invention, the inventors have invented several inventions related to current sense amplifiers, which may be used with the above memory architecture inventions or separately. Exemplary sense amplifier according to these inventions are powered by a supply voltage provided between a first supply line and a second supply line, and comprise a first sense input for receiving a current from a bit line, a second sense input for receiving a current from a bit line, a first impedance element coupled between the first sense input and a source of constant voltage, and a second impedance element coupled between the second sense input and the source of constant voltage. A differential current generating circuit is included. It has two inputs coupled to respective ones of the first and second sense inputs and two outputs, the input impedances of the outputs being greater than the input impedances of the inputs. The differential current generating circuit generates differential currents at its outputs as a function of the difference in currents presented at its inputs, in response to an enable signal. The enable signal has an active state and an inactive state.

In one current sense amplifier invention, a transistor is coupled between the first and second sense terminals for electrically coupling the sense terminal when the enable signal is in its inactive state.

In another current sense amplifier invention, a current-driven voltage latch is coupled to outputs of the differential current generating circuit, with the voltage latch generating an output voltage in relation to the difference in currents at the outputs of the differential current generating circuit.

In another current sense amplifier invention, the differential current generating circuit comprises a pair of cross-coupled transistors, each cross-coupled transistor having its source terminal coupled to a respective one of the sense inputs, and further having its drain terminal coupled to the gate terminal of the other cross-coupled transistor. The differential current generating circuit further comprises a pair of cascode transistors, each cascode transistor having its gate terminal coupled to an enabling signal, and further having its source terminal coupled to the drain terminal of a respective one of the cross-coupled transistors. The enabling signal, which may be the complement of the previously mentioned enable signal, has a first state where the cascode transistors are placed in first conductive states and a second state where the cascode transistors are placed in second conductive states. The second conductive state of a cascode transistor is substantially less than the first conductive state of the cascode transistor. Additionally, the differential current generating circuit comprises a transistor coupled between the drain terminals of the cross-coupled transistors for electrically coupling drain terminals of the cross-coupled transistors when the enabling signal is in its first state.

Accordingly, an objective and an advantageous effect of the present inventions is to decrease the effects of noise on the read operations of memory devices.

Another objective and an advantageous effect of the present inventions is to increase the number of memory cells that can be associated with a bit line.

Yet another objective and advantageous effect of the present inventions is to increase the read speed performance of memory devices.

A further advantageous effect of the present inventions is to enable each of the above advantageous effects while maintaining a minimal size for the memory device.

DETAILED DESCRIPTION OF THE INVENTION

Figure 1:
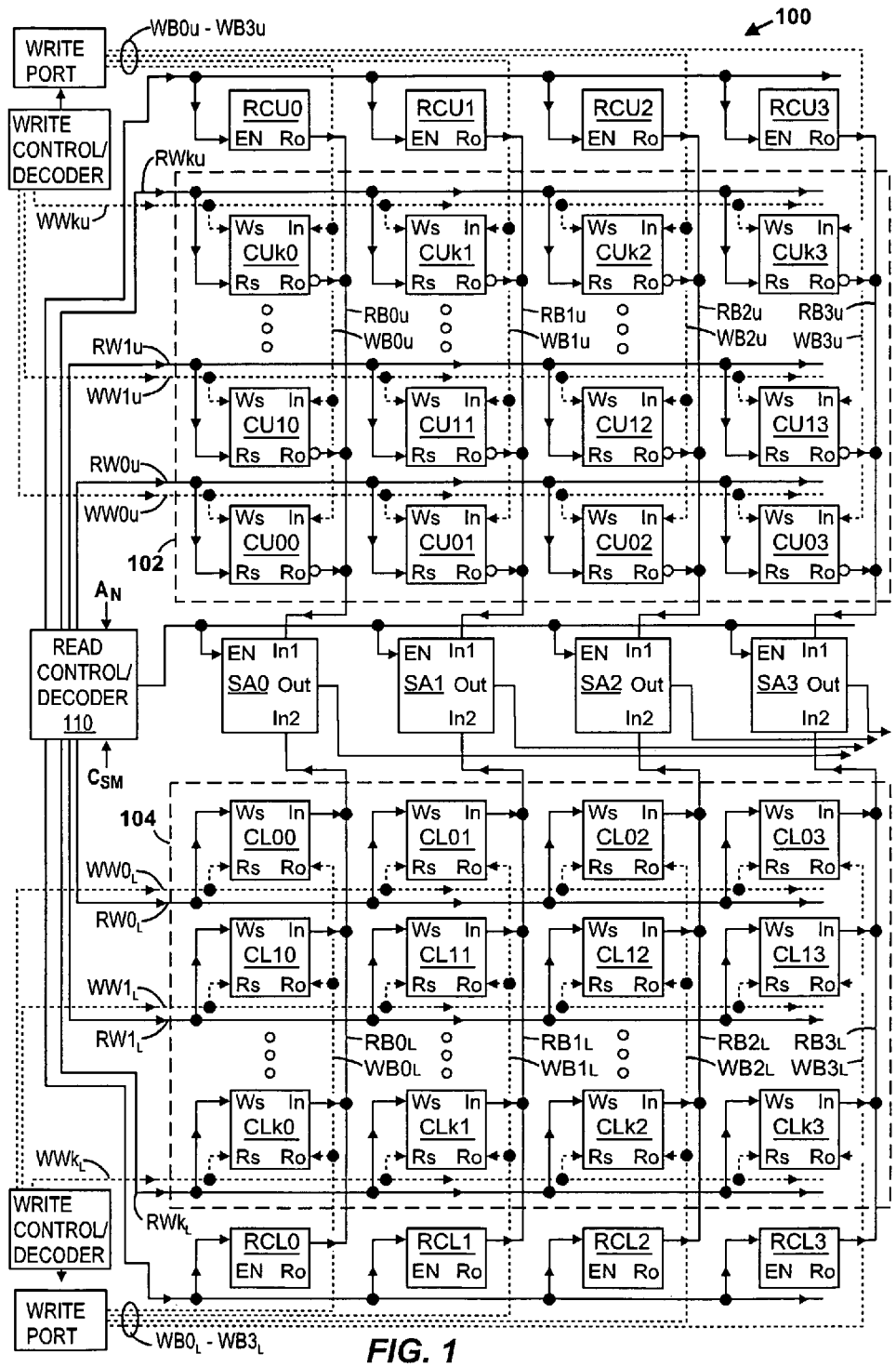
FIG. 1 shows a schematic diagram of an exemplary memory according to a first set of inventions of the present application.

FIGS. 1–5 illustrate an exemplary memory 100 according to the present invention. (Crossing signal lines shown in the figures are not electrically coupled unless there is a dot placed at their intersection.) Referring to FIG. 1, memory array comprises a plurality of memory cells divided into an upper array 102 and a lower array 104, preferably with equal amounts of memory cells per array. The memory cells are arranged in rows and columns, with the first four columns being shown in FIG. 1 (and later identified with numbers 0–3). Each of the arrays 102 and 104 preferably has an equal number of columns, and equal numbers of rows are assigned to each of the arrays. The memory cells of upper array 102 are identified with reference numbers CU00–CUk3, where the first two letters "CU" represent cells of the upper array, where the first number (e.g., 0, 1, . . . , k) represents the row number in the upper array, and where the last number represents the column number (e.g., 0, 1, 2, or 3). In a similar manner, the memory cells of lower array 104 are identified with reference numbers CL00–CLk3, where the first two letters "CL" represent cells of the lower array, where the first number (e.g., 0, 1, . . . , k) represents the row number in the lower array, and where the last number represents the column number (e.g., 0, 1, 2, or 3). Each array has k+1 rows, indexed from 0 to k. The quantity (k+1) is usually a factor of 2, but need not be.

In a conventional memory device, a word line is associated with each row of a memory array, with the cells in that row being electrically coupled to the word line. When placed in an active state, the word line selects the memory cells in the associated row for a reading operation or a writing operation. The data to be read from, or written to, the selected memory cells is conveyed by a set of bit lines, each bit line being associated with a column of the memory array. Each memory cell in the column is electrically coupled to the associated bit line. A single bit line is often used to read and write data to the memory cells of a column of the memory. However, two separate bit lines may be used: a "read bit line" for reading data and a "write bit line" for writing data. In this case, a single word line may still be used for both read and write operations. However, it is possible to use two separate word lines per row: a "read word line" to select a row for a reading operation and a "write word line" to select a row for a writing operation. The approach of using a single bit line per column is typically found in high-density memories.

In addition, there are multi-port memories, which have multiple read bit lines per memory column and multiple write bit lines per memory column. This structure allows several rows of the memory array to be read and written during the same cycle of the memory clock. In this case, the data from each selected read row is placed in a respective "read port," and the data to be written to each selected write row is held by a respective "write port." Each read port is electrically coupled to a respective read bit line associated with each memory column, and each write port is electrically coupled to a respective write bit line associated with each memory column. A multi-port memory typically has multiple word lines to select the rows. Usually, a "read word line" is associated with each read port of the device, and is used to select a row of data that is to be conveyed to the associated read port by way of the associated read bit lines. Similarly, a "write word line" is associated with each write port of the device, and is used to select a row that is to be written with the data held by the associated write port (as conveyed by the associated write bit lines). Multi-port memories are typically used for low-density, high-speed memory caches and register files.

The present invention is applicable to all of the above memory types. (The present invention is also applicable to standard ground implementations of these memories as well as virtual ground implementations thereof.) Exemplary memory 100 is illustrated with a multiple bit line and multiple read line topology, but with a single read port and a single write port to simplify the presentation. Since the present invention principally pertains to the read operation of the memory device, the read word lines, read bit lines, and the read circuitry will be discussed in detail, while the write word lines, write bit lines, and the write circuitry will be discussed in less detail.

Each memory cell CU and CL has a data input "In" for receiving data to be input to the memory cell, a write select input "Ws" for receiving a signal indicating that the data at input "In" is to be stored in the memory cell, a data output "Ro" for providing a signal representative of the data held by the memory cell, and a read select input "Rs" for receiving a signal indicating a signal representative of the stored data of the cell is to be provided at output "Ro". Each memory cell CU in upper memory array 102 is electrically coupled to, and selected by, one of a plurality of read word lines $RW0_U$–$RWk_U$, depending upon its row location in array 102. Similarly, each memory cell CL in lower memory array 104 is electrically coupled to, and selected by one of a plurality of read word lines $RW0_L$–$RWk_L$, depending upon its row location in array 104. These electrical couplings are at the "Rs" inputs of the cells. The signals on the read word lines are generated by a read control/decoder 110, which receives a plurality of address lines $A_N$ and control signals $CS_M$ from the external circuit, and places the signal on one of the read word lines $RW0_U$–$RWk_U$, $RW0_L$–$RWk_L$ in an active state during a read operation, based on the address conveyed by the address lines $A_N$ and on the commands conveyed by the control signals $CS_N$. The signals on the remaining rows remain inactive. As such, only one of the rows is selected during a read operation.

In addition, each memory cell CU in upper memory array 102 has its Ro output electrically coupled to one of a plurality of read bit lines $RB0_U$–$RB3_U$, depending upon its column location in array 102. Similarly, each memory cell CL in lower memory array 104 has its "Ro" output electrically coupled to one of a plurality of read bit lines $RB0_L$–$RB3_L$, depending upon its column location in array 104. When selected by a signal on a read word line, each memory cell (CU or CL) generates a current at its Ro output that is representative of the data value stored by the cell. In preferred embodiments, the magnitude of the current is substantially zero for a first data state, and near or at a maximum magnitude of $I_M$ for a second data state. The current may be directed into the read bit line, or may be directed out of (i.e., drained from) the read bit line. In addition, the maximum current generated by the upper memory cells may be made different than the maximum current generated by the lower memory cells. However, this variation is currently not preferred. When a memory cell is not selected for a read operation, it preferably generates no current, or substantially zero current (i.e., only leakage current) at its "Ro" output.

Figure 2:
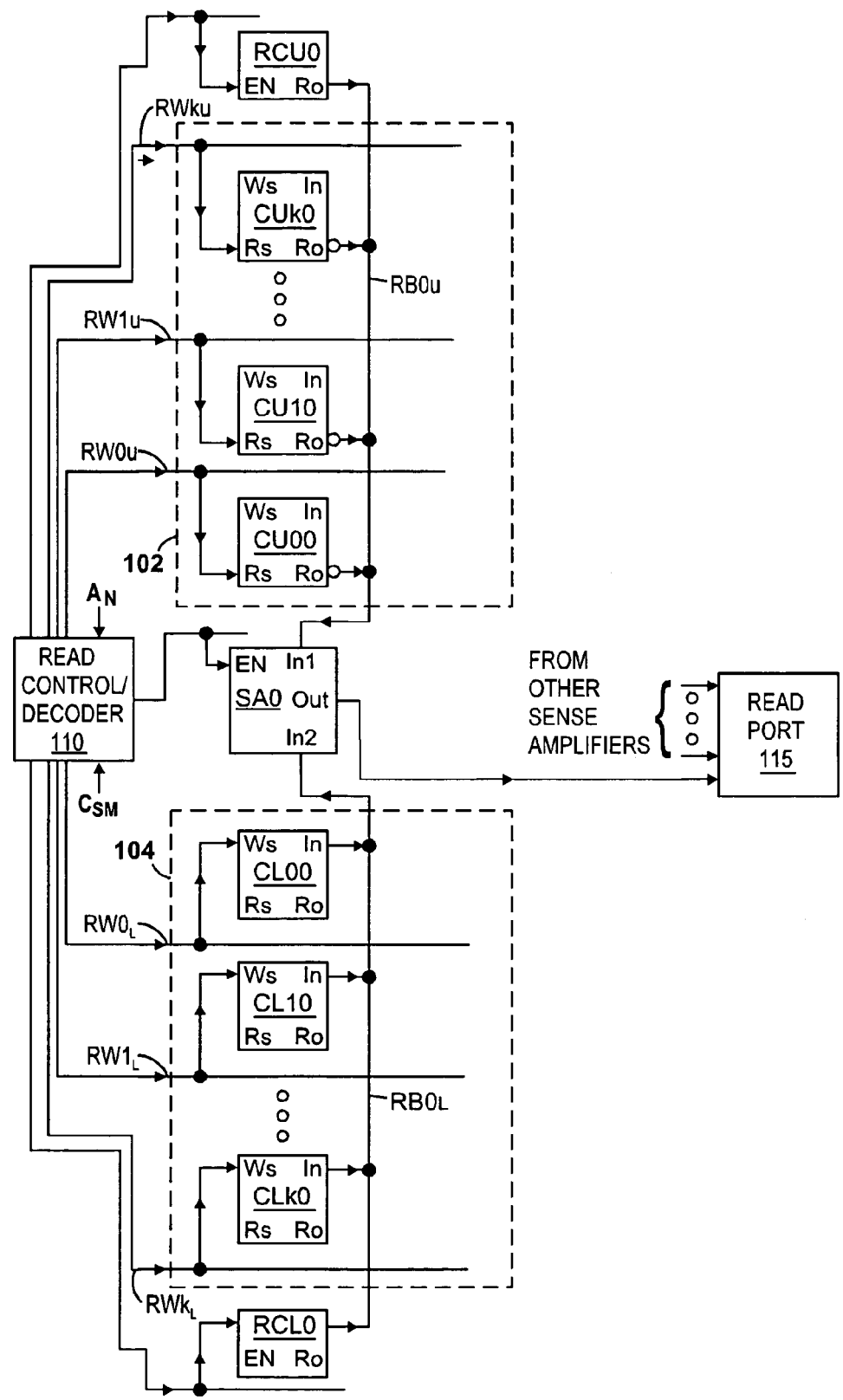
FIG. 2 shows a schematic diagram of the bit line structure along a column of the exemplary memory shown in FIG. 1 according to a first set of inventions of the present application.

The read bit lines are provided to a plurality of current sense amplifiers SA0–SA3, one sense amplifier being associated with each column of the memory. Each sense amplifier SA0–SA3 has a first current input "In1," a second current input "In2," an enable input "EN," and an output "Out" that provides a signal representative of the difference in currents present at the inputs "In1" and "In2" when an enable signal is present at the "EN" input. The "In1" inputs of sense amplifiers SA0–SA3 are electrically coupled to respective read bit lines $RB0_U$–$RB3_U$ for upper array 102, and the In2 inputs of sense amplifiers SA0–SA3 are electrically coupled to respective read bit lines $RB0_L$–$RB3_L$ for lower array 104. Each of the "EN" inputs is coupled to a control signal generated by read control decoder 110. The "Out" outputs of the sense amplifiers SA0–SA3 are provided to a read port 115, which is shown in FIG. 2. We describe the sense amplifiers SA0–SA3 and read circuitry in greater detail after we provide an overview of the write circuitry.

As to the circuitry for the write operations, each memory cell CU in upper memory array 102 is electrically coupled to, and selected by, one of a plurality of write word lines $WW0_U$–$WWk_U$, depending upon its row location in array 102. Similarly, each memory cell CL in lower memory array 104 is electrically coupled to, and selected by one of a plurality of write word lines $WW0_L$–$WWk_L$, depending upon its row location in array 104. These electrical couplings are at the "Ws" inputs of the cells. The write word lines are generated by a write control decoder, which receives the address lines $A_N$ and control signals $CS_M$ from the external circuit, and places one of the write word lines in an active state based on the address conveyed by the address lines $A_N$ and on the commands conveyed by the control signals $CS_M$. (As the present invention focuses on the read operation and not the write operation, the provision of these signals to the Write Control/Decoder is not shown in FIG. 1.) In addition, each memory cell CU in upper memory array 102 has its "In" input electrically coupled to one of a plurality of write bit lines $WB0_U$–$WB3_U$, depending upon its column location in array 102. Similarly, each memory cell CL in lower memory array 104 has its "In" input electrically coupled to one of a plurality of write bit lines $WB0_L$–$WB3_L$, depending upon its column location in array 104. While separate sets of write bit lines $WB0_U$–$WB3_U$ and $WB0_L$–$WB3_L$ have been shown in FIG. 1, a single set of write bits lines may be used to write data to both arrays 102 and 104. In other words, $WB0_U$ may be electrically coupled to $WB0_L$, $WB1_U$ may be electrically coupled to $WB1_L$, and so on.

As one inventive aspect of the present invention, separate read bit lines are used for the same column in each of the upper and lower arrays 102, 104, even though only one row (either in the upper array 102 or the lower array 104) is selected during a read operation. This is different from conventional memories, where a single read bit line for each row is used, or where local read bit lines are electrically coupled to a global read bit line (where the voltage, current, and data state, of the global read bit line is determined by one of the local read bit lines). This aspect of the present invention can be viewed as dividing a bit-line into two half-bit lines, and enabling the voltages, currents, and data states of the half bit lines to be independent from one another during the read operation (e.g., sensing operation). Thus, $RB0_U$ and $RB0_L$ are such half bit lines, as are $RB1_U$ and $RB1_L$, etc.

As another inventive aspect of the present invention, memory 100 comprises a first plurality of reference current circuits RCU0–RCU3 disposed near upper array 100, and a second plurality of reference current circuits RCL0–RCL3 disposed near lower array 104. Each reference current circuit has an enable input "EN" and an output "Ro", and generates a current with a magnitude $I_R$ at its "Ro" output when an active signal is provided to the "EN" input, and generates substantially little or no current (e.g., leakage current) when no active signal is provided to the "EN" input. Magnitude $I_R$ is substantially less than magnitude $I_M$ of the memory cells, and is preferably in the range of $0.25 \cdot I_M \leq I_R \leq 0.75 \cdot I_M$, and more preferably in the range of $0.30 \cdot I_M \leq I_R \leq 0.60 \cdot I_M$, and further preferably in the range of $0.35 \cdot I_M \leq I_R \leq 0.45 \cdot I_M$. In preferred embodiments, current $I_R$ is equal to or less than $0.5 \cdot I_M$. The "Ro" outputs of the first plurality of reference current circuits RCU0–RCU3 are coupled to the upper read half bits lines $RB0_U$–$RB3_U$, respectively, as shown in FIG. 1. Likewise, the "Ro" outputs of the second plurality of reference current circuits RCL0–RCL3 are coupled to respective lower read half bits lines $RB0_L$–$RB3_L$, respectively. The "EN" inputs of the first plurality of reference current circuits RCU0–RCU3 are coupled together and coupled to a first control output of read control/decoder 110. Likewise, the "EN" inputs of the second plurality of reference current circuits RCL0–RCL3 are coupled together and coupled to a second control output of read control/decoder 110.

As another inventive aspect of the present invention, when a read operation occurs, read control/decoder 110 determines which row of memory 100 is to be read by decoding the address bits $A_N$ and activating the corresponding read word line $RW0_U$–$RWk_U$, $RW0_L$–$RWk_L$. The activated row will be in either upper array 102 or lower array 104. If the selected row is in lower array 104, then read control/decoder 110 also generates an enable signal to the first plurality of reference current circuits RCU0–RCU3, which are coupled to the same read bit lines as the cells in upper array 102. On the other hand, if the selected row is in upper array 102, then read control/decoder 110 generates an enable signal to the second plurality of reference current circuits RCL0–RCL3, which are coupled to the same read bit lines as the cells in lower array 104. Thus, when cells in one of arrays 102, 104 are being selected for reading, the reference current circuits on the opposite side of the sense amplifiers are activated. Reference currents from one set of reference current circuits of magnitude $I_R$ are directed at either the "In1" set or "In2" set of inputs of sense amplifiers SA0–SA3, and memory cell currents from the cells of the selected row are directed at the other set of inputs of sense amplifiers SA0–SA3. Each selected memory cell directs a current at its associated sense amplifier that is substantially zero or that is at or near or a magnitude of $I_M$, which is larger than $I_R$. Thus, a current difference is presented to each sense amplifier, regardless of the stored data state of the memory cell being read.

The addressing function of read control/decoder 110 can be accomplished with the following circuitry. An exemplary read control/decoder 110 may comprise a conventional word-line decoder for each read word line, with each decoder decoding a unique one of the addresses that can be presented on address lines $A_N$. The construction of each individual decoder is well known to the art, and a description thereof is not needed in order to make and use the present invention. However, the addresses of the decoders are allocated such that all of the decoders for upper array 102 do not generate an enable signal on their respective read word lines when a selected bit $A_K$ of the address bits $A_N$ is in a logic low state. In additional, all of the decoders for lower array 104 do not generate an enable signal on their respective read word lines when the selected bit $A_K$ of the address bits $A_N$ is in a logic high state. The selected bit may be any bit, but would usually be the most significant bit or the least significant bit of $A_N$. Then a buffered version of the selected address bit $A_K$ is used as the enable signal "EN" to the lower reference current circuits RCL0–RCL3, and an inverted buffered version of the selected address bit $A_K$ is used as the enable signal "EN" to the upper reference current circuits RCU0–RCU3. It may be appreciated that the above assignment of logic high and logic low states may be exchanged. Instead of the above approach, it may be appreciated that, regardless of the number and arrangement of the words and their addresses in the upper and lower arrays, the enable signals to the reference current circuits RCU can be specified by Boolean functions of the address bits, and that the enable signals can therefore be generated by corresponding Boolean logic.

As further inventive aspect of the present invention, these currents are provided to current sense amplifiers (the half bit lines are coupled to the "In1" and "In2" inputs of current sense amplifiers SA0–SA3) rather than to voltage sense amplifiers. The current sense amplifier keeps the voltages of its inputs substantially the same, and focuses on sensing the difference in magnitudes between the currents presented at its inputs. The use of current sense amplifiers with the above reference current circuits enables the read output circuitry of the memory cells to be designed to provide a greater difference between the leakage current of the unselected state and the output current level of the selected state. In addition, the current sense amplifier requires a smaller difference in current magnitude than that required by a voltage sense amplifier.

Each of current magnitudes $I_M$ and $I_R$ is preferably at least 100 times larger, and preferably at least 500 times larger, than the maximum expected leakage current on the bit line to which the current is coupled. Oftentimes, both current magnitudes are 1,000 times larger. We describe how this maximum expected leakage current can be computed. The leakage current arises on the bit line from all the non-selected memory cells on the bit line, which is k for the bit line which has the memory cell being read, and (k+1) for the bit line which has all non-selected memory cells (k is defined above). As described below in greater detail, each of the non-selected memory cells has an NMOS selection transistor coupled to the bit line at its drain terminal to selectively couple current to the bit line (it is possible to use a PMOS transistor instead of an NMOS transistor). The NMOS selection transistor has a channel width $W_S$, a channel length $L_S$, a gate-to-source voltage of substantially zero when turned off, and a maximum possible Vds voltage of (Vdd—Vss). In the semiconductor industry, it is commonplace to define a general sub-threshold leakage current $I_{N,LEAK}$ for an NMOS transistor of an integrated-circuit technology as equal to the amount of drain current passed by an NMOS transistor having a width of one micron (1 μm) and a channel length equal to the minimum channel length $L_{MIN}$ allowed by the integrated-circuit technology, with a voltage of (Vdd—Vss) being applied between the drain and source terminals of this NMOS transistor, and with zero volts being applied between the gate and source terminals of this NMOS transistor. A PMOS transistor leakage current $I_{P,LEAK}$ of the technology is similarly defined. Thus, we define the maximum expected leakage current of the read bit line to be equal to $(k+1) \cdot W_S \cdot I_{N,LEAK}$ when NMOS selection transistors are used, and equal to $(k+1) \cdot W_S \cdot I_{P,LEAK}$ when PMOS selection transistors are used. Since the exemplary selection transistors described below have channel lengths longer than $L_{MIN}$, the actual leakage current is less than this amount (leakage current decreases with increasing channel length).

In one exemplary integrated circuit technology used to construct an exemplary memory device 100, NMOS leakage current $I_{N,LEAK}$ has a value of 3 nA per micron of channel width, and the NMOS selection transistor have $W_S$=0.80 µm. For $(k+1)$=16, the maximum expected leakage current would be $16 \cdot (0.80 \text{ µm}) \cdot (3 \text{ nA/µm})$=38.4 nA. In this exemplary memory device 100, $I_M$ is approximately 170 µA and $I_R$ is approximately 65 µA, both of which are more than 1,000 time larger that the maximum expected leakage current of 38.4 nA (=0.0384 µA). Thus, in contrast to prior art memories using voltage sense amplifiers, substantial amounts of currents are present on both of the bit lines coupled the current sense amplifier when reading a memory cell that is generating a current of $I_M$ on the bit line (in correspondence to the data being held by the memory cell). In the case, the amount current flowing in each bit line, as measured at the inputs of the current sense amplifier, is substantially above the total of the sub-threshold leakage currents on the bit line.

Exemplary Circuit Implementations (FIGS. 2–5).

Figure 3:
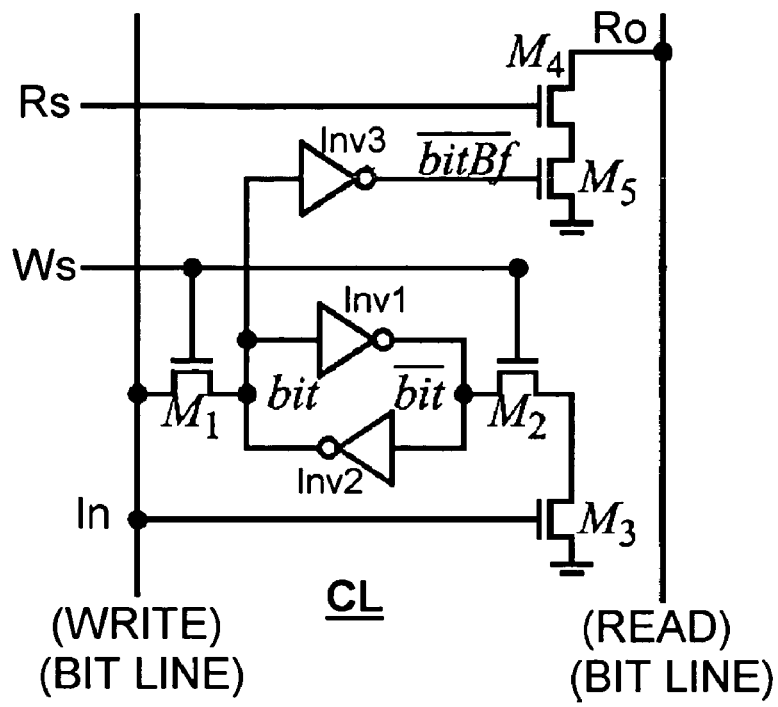
FIG. 3 shows a schematic diagram of a first exemplary memory cell according to a first set of inventions of the present application.
Figure 4:
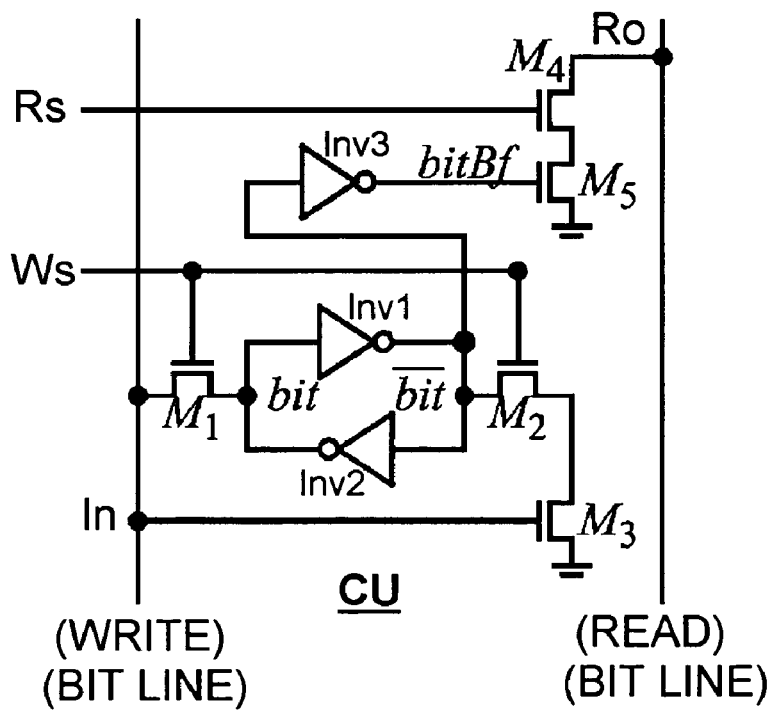
FIG. 4 shows a schematic diagram of a second exemplary memory cell according to a first set of inventions of the present application.
Figure 5:
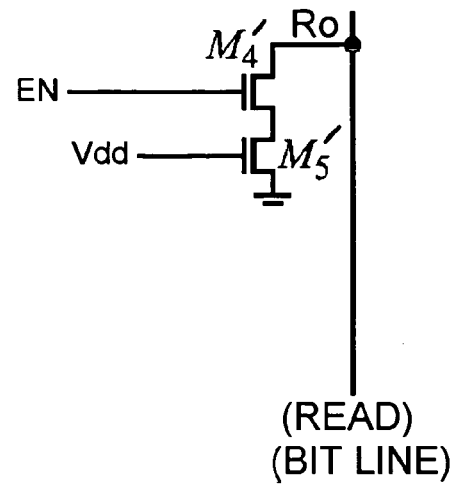
FIG. 5 shows a schematic diagram of an exemplary reference current circuit according to a first set of inventions of the present application.

Having given a general overview of memory 100, we discuss the read and write operations on one memory column in greater detail with respect to FIG. 2, and provide exemplary memory cell circuits in FIGS. 3 and 4, and a reference current circuit in FIG. 5. In one exemplary implementation of memory 100, during a read operation, a selected memory cell CU in upper array 102 generates current of magnitude $I_M$ at its "Ro" output when the cell is storing a "1" data value, and generates substantially no current at its "Ro" output when the cell is storing a "0" data value. On the other hand, a memory cell CL in lower array 104 generates substantially no current at its "Ro" output when the cell is storing a "1" data value, and generates a current of magnitude $I_M$ at its "Ro" output when the cell is storing a "0" data value. This polarity difference is indicated by the circle attached to the "Ro" outputs of the memory cells CU in upper array 102 (as shown in both of FIGS. 1 and 2). The polarity difference is optional, and its benefit is explained below. When activated, a reference current circuit (RCU, RCL) generates a current value of lesser magnitude than the maximum magnitude $I_M$ of the selected memory cell, e.g., 0.4 $I_M$. The reference current circuit generates substantially no current when not activated. Thus, a current magnitude of 0.4 $I_M$ is presented to one input of the sense amplifier, while a current magnitude of substantially zero or substantially $I_M$ is provided to other input, depending on the stored data value of selected the memory cell.

The inputs of sense amplifiers SA0–SA3 can be coupled to the read half bit lines so that each sense amplifier outputs a representation of a "0" data value when the current magnitude from the upper half bit line is less than the current magnitude from the lower half bit line, and to output a representation of a "1" data value when the current magnitude from the upper half bit line is greater than the current magnitude from the lower half bit line. This would occur regardless of whether the selected memory cell were located in upper array 102 or lower array 104. Thus, a stored "1" data value in a selected memory cell CU from upper array 102 would present current magnitude $I_M$ to the upper half bit line, while the lower reference current circuit RCL0 would present a lesser magnitude of 0.4 $I_M$ to the lower half bit line, causing the sense amplifier SA0 to output a "1" data value (in correspondence to the stored "1" data value). On the other hand, if the selected memory cell CU from the upper array is storing a "0" value, a current of substantially zero would be presented to sense amplifier SA0, and the sense amplifier would output a "0" data value since the reference current circuit RCL0 is presenting a higher current magnitude of 0.4 $I_M$. For memory cells in lower array 104, a selected memory cell CL storing a data "1" value would present substantially zero current to the lower half bit line, while the upper reference current circuit RCU0 would present a higher current magnitude of 0.4 $I_M$ to the upper half bit line, causing the sense amplifier SA0 to output a "1" data value because the current magnitude in the upper half bit line is larger than the current magnitude in the lower half bit line. Thus, the output of sense amplifier SA0 is in correspondence with the stored "1" data value in the memory cell CL in the lower array. When the selected memory cell CL in lower array 104 is storing a "0" data value, it would present a current magnitude of substantially $I_M$, causing the sense amplifier SA0 to take the opposite action and output a data "0" value. As can be seen, the above arrangement of memory arrays 102 and 104 with the difference in cell polarity enables the sense amplifier to output a data value which corresponds to the data value stored by the memory cell, regardless of whether the memory cell is in the upper or lower array.

We point out that the present invention can be practiced without the difference in cell polarity, in which case the construction of the memory cells in upper array 102 would be the same as the construction of the memory cells in lower array 104 (and no circle would be present at the "Ro" outputs of the memory cells CU of the upper array). In this case, however, the read port or the sense amplifier would have to invert the output of the sense amplifier whenever a cell in upper array 102 is selected. This can be readily done by adding, either to the sense amplifier or to the read port (preferable), decoding circuitry and a selective inversion stage that is responsive to the decoding circuitry. This is a relatively simple matter when one of the address bits $A_N$ is used to determine whether a memory cell in the upper array or a memory cell in the lower array is selected for reading. In this case, the decoding circuitry need only comprise a provision of this address bit to the selective inversion stage, which in turn may comprise an exclusive-OR gate (XOR gate) having a first input coupled to the address bit and a second input coupled to the output of the sense amplifier.

FIG. 3 shows a schematic diagram of an exemplary implementation of a memory cell CL of lower array 104. The data value is stored by a pair of inverters Inv1 and Inv2, which are cross-coupled (the input of each inverter is coupled to the other's output). The state of the stored data value is represented as "bit," and is taken at the input of inverter Inv1 and the output of inverter Inv2. The data is written into inverters Inv1 and Inv2 by way of transistors $M_1$, $M_2$, and $M_3$. When an active signal (e.g., a high voltage value) is present at write select input "Ws", which is coupled to a write word line, transistors $M_1$ and $M_2$ are turned on, and transistor $M_3$ is turned on if the data input value is "1" (e.g., a high voltage). This causes "bit" to take a "1" data value (high voltage) when the data input value at the "In" input is "1" because the input to Inv1 is pulled high by the "In" input while the input to Inv2 is pulled low to ground through transistors $M_2$ and $M_3$. If, on the other hand, the data input value at the "In" input is a "0" data value (e.g., low voltage), the input to Inv1 is grounded causing "bit" to take a "0" data value. The output of Inv1 switches to a logic high value (if not already there) without obstruction from the ground through transistor $M_3$. The output strength of Inv2 is generally made less than the output strength of Inv1 to allow the "In" input to more easily ground the input of Inv1 with little obstruction from the output of Inv2.

Data is read from the memory cell by way of buffer inverter Inv3 and transistors $M_4$ and $M_5$. Transistor $M_4$ acts as a select transistor for the memory cell, and it has its gate coupled to read select input "Rs", its drain coupled to data output "Ro", and its source coupled to the drain of transistor $M_5$. Transistor $M_5$ has its source coupled to ground, and its gate coupled to the output of inverter Inv3 (which in turn has its input coupled to "bit"). Transistor $M_5$ is not conductive when "bit" has a "1" data value, and therefore substantially no current is coupled to the read bit line at the "Ro" output. On the other hand, when "bit" has a "0" data value, transistor $M_5$ is conductive; and when transistor $M_4$ is turned on by the "Rs" input, a current is drained from the bit line through the "Ro" output. The magnitude of this current is set by the dimensions of the transistors $M_4$ and $M_5$ (W/L ratios) and the voltage present on the bit line, which is preferably held substantially constant by the current sense amplifier SA. If the cell is not selected, transistor $M_4$ is not conductive, and substantially no current flows (except leakage current), regardless of the state of transistor $M_5$. It may be appreciated that the positions of transistors $M_4$ and $M_5$ with respect to one another in the transistor stack may be exchanged.

If memory cell CU were to be used with a conventional voltage sense amplifier, transistors $M_4$ and $M_5$ would be constructed to have the highest possible current conduction capability. This would mean that the channel lengths (L) of the devices would be set at the minimum value allowed by the integrated circuit fabrication process for making memory 100, and the channel widths (W) would be made relatively large, giving a large W/L ratio for each transistor. However, such a construction leads to high leakage currents, and the problems noted in the above "Background of the Invention" section of the present application. In contrast, the channel lengths of transistors $M_4$ and $M_5$ are preferably made longer than the minimum channel length value $L_{MIN}$ allowed by the integrated circuit fabrication process for making memory 100, leading to lower W/L ratios and substantially lower leakage currents (e.g., lower sub-threshold currents). This, in conjunction with using current sensing, substantially eliminates any noise problems associated with the sub-threshold currents of the non-selected memory cells coupled to the read half bit lines.

Typically, the channel length of transistors $M_4$ and $M_5$ decreases as the number of word lines increase in order to compensate for the increase in the resistance of the bit lines (which is caused by the need to increase the length of the bit lines to span over more word lines). As one design example, the inventors have used channel lengths of $1.8 \cdot L_{MIN}$ for 32 word lines (16 in each of arrays 102 and 104), and have used channel lengths of $1.2 \cdot L_{MIN}$ for 128 word lines. This can generally be written for any number of word lines as follows:

Channel Length=[2.0−(number of word lines)/160]
$\cdot L_{MIN}$.

For this, one may use the following design bound:

Channel Length≧[2.0−(number of word lines)/160]
$\cdot L_{MIN}$,

Or this design bound:

Channel Length≧[1.9−(number of word lines)/160]
$\cdot L_{MIN}$,

Thus, in contrast to prior art voltage sensing approaches, the channel length of transistors $M_4$ and $M_5$ are at least 20% longer than $L_{MIN}$, and typically at least 50% longer.

FIG. 4 shows a schematic diagram of an exemplary implementation of a memory cell CU of upper array 102. It has the same construction and properties as the implementation of memory cell CL described above, except that the input of buffer inverter Inv3 is coupled to the output of Inv1 rather than the output of Inv2 (i.e., it is coupled to "bit"). This provides the difference in polarity between memory cells CU and CL.

FIG. 5 shows a schematic diagram of a reference current circuit, which may be used for any of reference current circuits RCU0–RCU3 and RCL0–RCL3. It comprises the same transistors $M_4$ and $M_5$ of memory cell CL and CU in the same configuration, except that the gate of transistor $M_4$ is coupled to the "EN" input, the gate of transistor M5 is coupled to supply voltage Vdd, and the widths (W) of transistors $M_4$ and $M_5$ are approximately 40% of the widths used by transistors $M_4$ and $M_5$ in memory cells CL and CU. The channel lengths remain the same. Because of the differences in widths, we have added a prime symbol to the notation of transistors $M_4'$ and $M_5'$ for the reference current circuits. Typically, the widths of transistors $M_4'$ and $M_5'$ of the reference current circuits are set at the minimum width $W_{MIN}$ allowed by the fabrication process, while the widths of transistors $M_4$ and $M_5$ of the memory cells are set at around $2.5 \cdot W_{MIN}$, and generally in the range of $1.33 \cdot W_{MIN}$ to $4 \cdot W_{MIN}$. The difference in widths provides the difference in maximum current magnitudes drawn by the different circuits, as discussed above. Thus, typically, the W/L ratios of transistors $M_4'$ and $M_5'$ of the reference current circuits range between $0.5 \cdot W_{MIN}/L_{MIN}$ and $0.9 \cdot W_{MIN}/L_{MIN}$. The W/L ratios of transistors $M_4$ and $M_5$ of the memory cells are less than approximately $3.4 \cdot W_{MIN}/L_{MIN}$, and preferably less than approximately $1.7 \cdot W_{MIN}/L_{MIN}$ (taken at $L=1.2 \cdot L_{MIN}$).

Thus, it may be appreciated that the present invention also comprises a general method of reading data stored in a memory comprising the above-described memory cells. The method comprises selecting a memory cell in one of the upper and lower arrays by providing a signal to its read-select input, such as by way of a respective read word line. The method further comprises the steps of coupling a reference current $I_{R1}$ to a bit line for the lower array when the above step selects a memory cell in the upper array, and of coupling a reference current $I_{R2}$ to a bit line for the upper array when the above step selects a memory cell in the lower array. The relative magnitudes of the reference currents with respect to the magnitudes of the memory-cell currents are as described above. Finally, the general method comprises sensing a difference in the currents on the bit lines with a current sense amplifier.

As we mentioned above, the present invention may be applied to memories having multiple read ports and multiple write ports. For simplicity, we have shown memory 100 with a single read port and a single write port. Here, for the benefit of the reader, we briefly describe how the structures of memories CL and CU may be augmented to work with multiple write ports and multiple read ports. For both cell CL and CU, transistors $M_1$, $M_2$, and $M_3$ would be replicated for each additional write port, and these replicated transistors would be coupled to an additional write word line and additional write bit lines. In a similar manner, transistors $M_4$ and $M_5$ would be replicated for each additional read port, with the gate of transistor $M_4$ being coupled to an additional read word line and the drain of transistor $M_4$ being coupled to an additional read half bit line. The gate of the additional transistor $M_5$ would be coupled to the output of buffer inverter Inv3.

Figure 6:
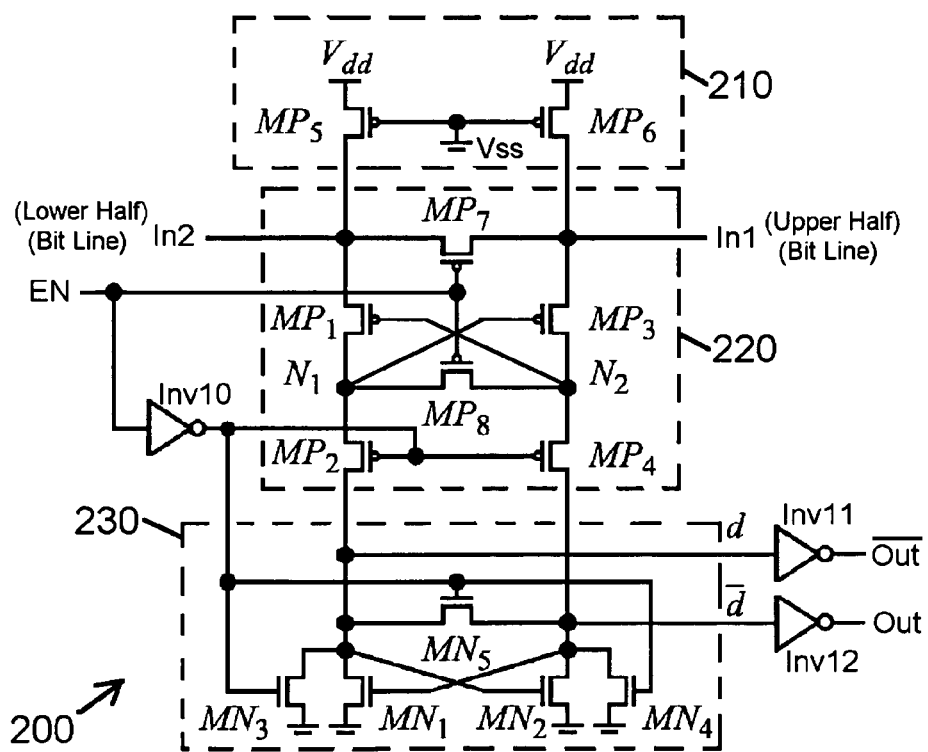
FIG. 6 shows a schematic diagram of an exemplary current sense amplifier according to a second set of inventions of the present application.

FIG. 6 shows an exemplary differential current sense amplifier 200 which may be used with the present invention described above, and which itself embodies additional inventions of the present application. Sense amplifier 200 has a first current input "In1" (which is coupled to an upper read half bit line in memory 100), a second current input "In2" (which is coupled to a lower read half bit line in memory 100), an enable input "EN" (which is controlled by read control/decoder 110), an output "Out" that provides a representation of the sensed data state, and a complemented output "$\overline{\text{Out}}$." Sense amplifier 200 comprises the following general circuit components:

A pair of impedance elements 210, such as for example provided by PMOS transistors $MP_5$ and $MP_6$. Each impedance element is coupled between a respective sense input "In1" and "In2" and a source of substantially constant voltage (e.g., Vdd). The pair of impedance elements have substantially the same current-voltage characteristics, and operate to maintain the voltages at sense inputs "In1" and "In2" (and the half bit lines) within a target range close to the constant voltage (e.g., close to Vdd).

A differential current generating circuit 220, such as for example provided by PMOS transistors $MP_1$, $MP_2$, $MP_3$, $MP_4$, $MP_7$, and $MP_8$. The differential generating circuit has low-input impedance inputs coupled to the sense inputs, and high input-impedance outputs that provide differential currents that are a function difference in current present at the circuit's inputs.

A current-driven voltage latch 230, such as for example provided by NMOS transistors $MN_1$, $MN_2$, $MN_3$, $MN_4$, and $MN_5$. The voltage latch 230 generates an output voltage in relation to the difference in currents at the outputs of the differential current generating circuit 220.

The enable signal "EN" of sense amplifier 200 has an active state and an inactive state. During the inactive state (e.g., "EN" near ground, Vss), the impedance elements 210 (e.g., transistors $MP_5$ and $MP_6$) bring the sense inputs "In1" and "In2" to the voltage level of Vdd (the constant voltage source). The read half bit lines coupled to the sense inputs "In1" and "In2" are thereby brought to the level of the constant voltage source. To ensure that both sense inputs (and both bit lines) are at the same voltage, PMOS transistor $MP_7$ may be used to equalize the voltages of the two, as shown in FIG. 6. Also during the inactive state of signal "EN," the differential current generating circuit 220 is placed in an initialization state where substantially no currents are being provided at its outputs, and the current-driven voltage latch 230 is placed in a reset state. During the active state (e.g., "EN" near Vdd), the impedance elements 210 loosely clamp the voltages of the sense inputs, generally keeping them with 0.25·(Vdd—Vss) of the constant voltage (e.g., Vdd), and preferably within 0.2·Vdd and more preferably within 0.15·Vdd. Vss is the voltage of the ground line, which is usually zero. Also during the active state of signal "EN," the differential current generating circuit 220 is enabled to generate differential currents at its outputs as a function of the difference in currents presented at its inputs, and the current-drive voltage latch 230 is enabled to convert these currents to a latched voltage state. The operation of each of the last two circuits is described below in greater detail.

As an example, the differential current generating circuit 220 comprises a pair of cross-coupled PMOS transistors $MP_1$ and $MP_3$, a pair of cascode PMOS transistors $MP_2$ and $MP_4$, a first equalizing PMOS transistor $MP_7$ (described above) and a second equalizing PMOS transistor $MP_8$. As shown in FIG. 6, each cross-coupled transistor $MP_1$ and $MP_3$ has its source terminal coupled to a respective one of the sense inputs "In2" and "In1," and further has its drain terminal coupled to the gate terminal of the other cross-coupled transistor. Each cascode transistor $MP_2$ and $MP_4$ has its gate terminal coupled to the complement of the enable signal "EN," as provided through an inverter Inv10, and further has its source terminal coupled to the drain terminal of a respective one of the cross-coupled transistors $MP_1$ and $MP_4$, as shown in FIG. 6. These latter couplings occur at two nodes, which we have designated as nodes $N_1$ and $N_2$, as shown in FIG. 6. Equalizing transistor $MP_8$ has its source and drain terminals coupled to nodes $N_1$ and $N_2$, and its gate terminal coupled to enable signal "EN." When enable signal "EN" is in its inactive state (e.g., "EN" near Vss), transistor $MP_8$ equalizes the voltages of nodes $N_1$ and $N_2$ to a level of approximately (Vdd−$V_{thp1}$), where $V_{thp1}$ is the pFET threshold voltage of transistors $MP_1$ and $MP_3$. Also in the inactive state of enable signal "EN," the cascode transistors $MP_2$ and $MP_4$ are placed in substantially non-conductive states, which de-couples the differential current generating circuit 220 from the current-driven voltage latch 230, and allows transistor $MP_8$ to set each of nodes $N_1$ and $N_2$ to a voltage of substantially (Vdd−$V_{thp1}$).

When the enable signal "EN" is placed it its active state, cascode transistors $MP_2$ and $MP_4$ are placed in highly conductive states. The voltages on nodes $N_1$ and $N_2$ diverge depending upon the current difference present as sense inputs "In1" and "In2." Upon initial activation of signal "EN," cross-coupled transistors $MP_1$ and $MP_3$ try to conduct the same amount of current Io through their channels (source to drain). In response to this, transistors MP5 and MP6 (impedance elements 210) also begin to conduct current. If there is a current imbalance at sense inputs "In1" and "In2" (which the above-described memory architecture provides), one of transistors $MP_1$ and $MP_3$ will conduct less current than the other. For example, we take the case where transistor $MP_1$ initially conducts less current than transistor $MP_3$ because current is being drained away on the lower half bit line at faster rate than the current being drained away on the upper half bit line. As a result, the voltage at second sense input "In2" droops in value, causing the Vgs of transistor $MP_1$ to decrease. More importantly, the lower current through transistor $MP_1$ causes the Vgs voltage and current of cascode transistor $MP_2$ to be lowered (which can readily occur since the drain of $MP_1$ presents a high impedance to the source of transistor $MP_2$, allowing the Vgs of $MP_2$ to quickly change). The lowering of Vgs of transistor $MP_2$ causes the voltage of node $N_1$ to lower. But since the node $N_1$ is coupled to the gate of transistor $MP_3$, the amount of current conducted by transistor $MP_3$ increases above the initial value Io. In turn, this increases the voltage at node $N_2$ and the Vgs of cascode transistor $MP_4$, the latter of which causes the current of transistor $MP_4$ to match that of transistor $MP_3$. (The Vgs of transistor $MP_4$ can readily increase since the drain of $MP_3$ presents a high impedance to the source of $MP_4$.) The rise in the voltage of node N2 further decreases the Vgs of transistor $MP_1$, causing it to conduct less. Thus, the cross coupling of transistors $MP_1$ and $MP_3$ provides a feedback loop, which causes node $N_1$ to be discharged to approximately $2 \cdot V_{thp2}$ (where $V_{thp2}$ is the threshold voltage of transistors MP2 and MP4) and node $N_2$ to be charged to Vdd.

Therefore, depending upon the current difference at the sense inputs "In1" and "In2", one of transistors $MP_1$ and $MP_3$ turns off (provides no current) while the other remains conducting (providing current). In preferred embodiments of the present invention, the currents on the read half bit lines are activated by read control/decoder 110 and/or Inv10 before cascode transistors $MP_2$ and $MP_4$ are turned on. This delay prevents any noise on the bit lines, as present at sense inputs "In1" and "In2," from causing nodes $N_1$ and $N_2$ to diverge in the wrong directions. The delay provided by Inv10 enables equalizing transistor $MP_7$ to turn off just before cascode transistors $MP_2$ and $MP_4$ are turned on.

Current-driven voltage latch 230 comprises a pair of cross-coupled NMOS transistors $MN_1$ and $MN_2$, where the gate terminal of each of these transistors is coupled to the drain terminal of the other of these transistors, and the source terminals of both transistors are coupled to a second constant voltage level Vss (e.g., ground), as shown in FIG. 6. The drain terminal of transistor $MN_1$ is coupled to the drain terminal of transistor $MP_2$ (which is one output of circuit 220) and the drain terminal of transistor $MN_2$ is coupled to the drain terminal of transistor $MP_4$ (which is another output of circuit 220). During the inactive state of enable signal "EN," the gate and drain terminals of cross-coupled transistors $MN_1$ and $MN_2$ are substantially set to voltage level Vss (e.g., ground) by transistors $MN_3$ and $MN_4$, and little or no potential differences exist among the terminals of transistors $MN_1$ and $MN_2$. During the active state of enable signal "EN," the initial currents (Io) outputted by circuit 220 initially charge the gate terminals of transistors $MN_1$ and $MN_2$, and initiate current flow in these transistors. However, a differential current quickly develops in the outputs of circuit 200, and the charging of the gate terminal of one of transistors $MN_1$ and $MN_2$ is stopped, while the charging of the gate terminal of the other transistor continues. As a result, one of transistors $MN_1$ and $MN_2$ is turned off, allowing its drain voltage to rise to Vdd, while the other of transistors $MN_1$ and $MN_2$ is fully turned on, causing its drain voltage to fall to Vss. Once this occurs, the drain voltages of transistors $MN_1$ and $MN_2$ cannot be changed (i.e., they are latched) until the inactive state of signal "EN" occurs again, at which time transistors $MN_3$ and $MN_4$ turn on and reset the drain voltages of transistors $MN_1$ and $MN_2$. Therefore, the differential currents provided at the outputs of circuit 220 cause voltage levels Vss and Vdd to latched at the drains of transistors $MN_1$ and $MN_2$. These latched values are provided to the external circuit by buffer inverters Inv11 and Inv12. For memory 100 (shown in FIGS. 1–5), only output "Out" at Inv12 is needed, and is coupled to read port 115.

As an option, an equalizing transistor $MN_5$ may be included in current-driven voltage latch 230 to equalize the drain voltages of cross-coupled transistors $MN_1$ and $MN_2$ during the inactive state of "EN," in the case that the drain voltages are not able to completely reset during the inactive period.

Table I provides an exemplary listing of channel lengths, channel widths, and threshold values for the transistors of exemplary current sense amplifier 200, along with corresponding exemplary values for the transistors $M_4$ and $M_5$ of memory cells CU and CL, and reference current circuits RCL and RCU of exemplary memory 100. The minimum transistor channel width $W_{MIN}$ of the process is 0.32 μm, and the minimum transistor channel length $L_{MIN}$ of the process is 0.11 μm.

TABLE I

| Transistor | Width | Length | Threshold Voltage |
|---|---|---|---|
| $MP_5$, $MP_6$ | 2.50 μm | 0.11 μm | high-Vth |
| $MP_1$, $MP_3$ | 3.00 μm | 0.11 μm | low-Vth |
| $MP_2$, $MP_4$ | 1.50 μm | 0.11 μm | low-Vth |
| $MP_7$ | 1.00 μm | 0.11 μm | high-Vth |
| $MP_8$ | 0.32 μm | 0.11 μm | high-Vth |
| $MN_1$–$MN_5$ | 0.32 μm | 0.11 μm | low-Vth |
| Memory cells CU and CL | | | |
| $M_4$ | 0.80 μm | 0.20 μm | high-Vth |
| $M_5$ | 0.80 μm | 0.20 μm | high-Vth |
| Reference current circuits | | | |
| $M_4'$ | 0.32 μm | 0.20 μm | high-Vth |
| $M_5'$ | 0.32 μm | 0.20 μm | high-Vth |

The high-Vth and low-Vth values for the PMOS and NMOS transistors are provided in Table II.

TABLE II

| | |
|---|---|
| high-Vth PMOS | −0.222 V (=0.185% of Vdd-Vss (e.g., 1.2 V)) |
| high-Vth NMOS | 0.216 V (=0.180% of Vdd-Vss (e.g., 1.2 V)) |
| low-Vth PMOS | −0.128 V (=0.106% of Vdd-Vss (e.g., 1.2 V)) |
| low-Vth NMOS | 0.108 V (=0.090% of Vdd-Vss (e.g., 1.2 V)) |

Figure 7:
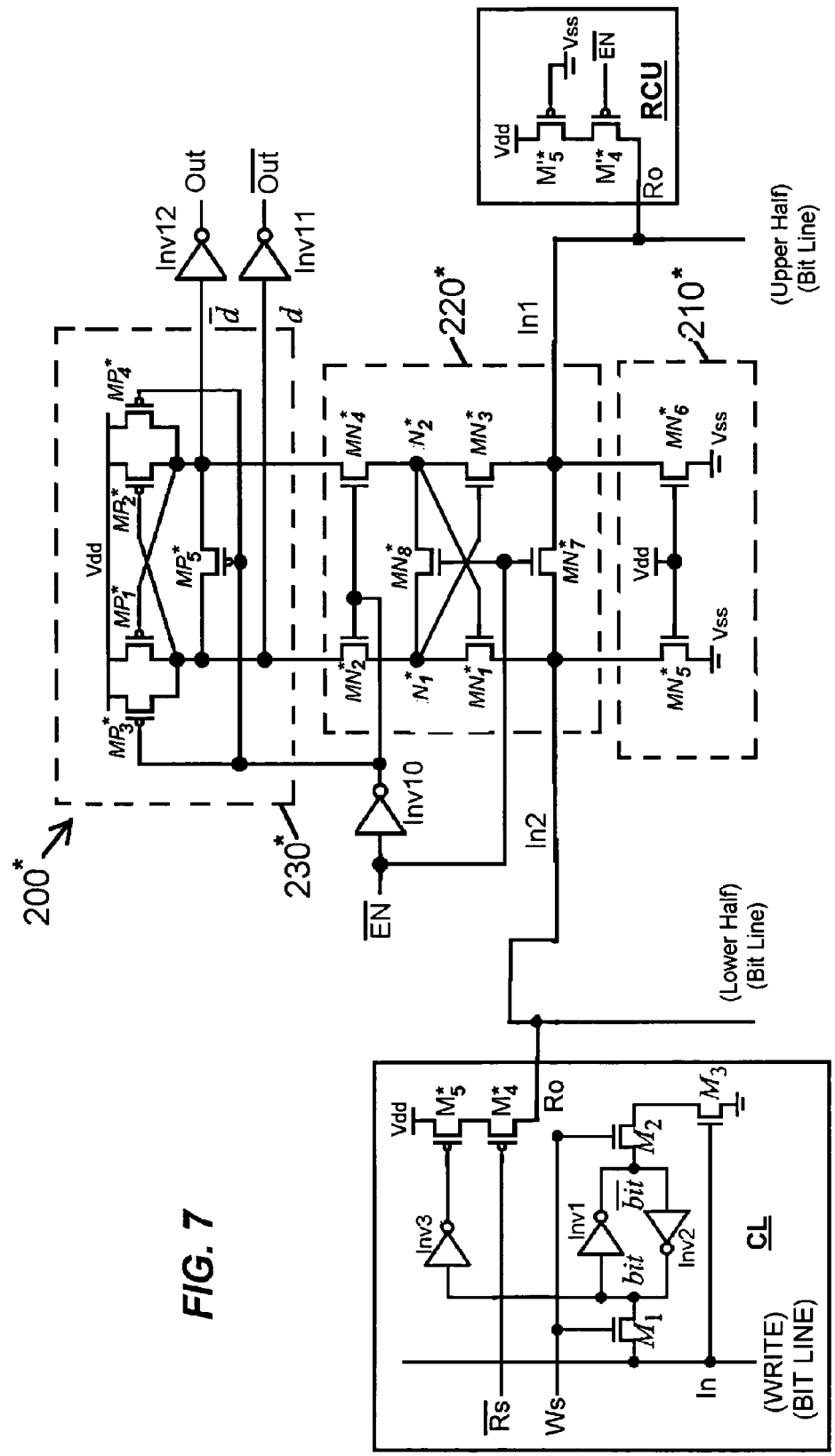
FIG. 7 shows a schematic diagram of another exemplary current sense amplifier according to a second set of inventions of the present application.

As previously mentioned, the memory architecture invention of the present application may be implemented where the memory cells (CUs, CLs) and reference current circuits (RCUs) drain current from the sense inputs of the current sense amplifiers, or push current into the sense inputs of the current sense amplifiers. Current sense amplifier 200 shown in FIG. 6 is best suited for implementations where currents are being drained from the sense inputs of the sense amplifier. FIG. 7 shows the circuit dual version 200* (or complement version) of sense amplifier 200. Dual version 200* is best suited for implementations where current is pushed into the sense inputs "In1" and "In2." The dual version is shown along with an exemplary memory cell CL and reference current circuit RCU, which have had their output transistors modified to push current rather than drain current. Transistors $M_4$* and $M_5$* of the modified cell are PMOS transistors, with the source of $M_5$ now being fed from Vdd rather than Vss. The same can be said for transistors $M_4'$* and $M_5'$* of the modified RCU. Signals Rs and EN have been inverted for use with the modified CL and RCU circuits. Upper memory cell CU is similarly modified.

Dual version 200* can be obtained from current sense amplifier 200 by changing each PMOS transistor to an NMOS transistor, by changing each NMOS transistor to a PMOS transistor, by exchanging Vdd and Vss (e.g, turning the circuit upside down), and by inverting the enable signal "EN". Components 210, 220, and 230 of amplifier 200 have dual versions 210*, 220*, and 230*, respectively, in dual version 200*, and each dual component provides the same functions and interconnections as its counterpart in amplifier 200. In the dual impedance elements 210*, NMOS transistors $MN_5$* and $MN_6$* provided the same impedance function and interconnections as PMOS transistors $MP_5$ and $MP_6$, respectively, of amplifier 200. In the dual differential current generating circuit 220*, NMOS transistors $MN_1$*, $MN_2$*, $MN_3$*, $MN_4$*, $MN_5$*, $MN_7$*, and $MN_8$* provided the same functions and interconnections as PMOS transistors MP$_1$, MP$_2$, MP$_3$, MP$_4$, MP$_5$, MP$_7$, and MP$_8$, respectively, of amplifier 200. In the dual current-driven voltage latch 230*, PMOS transistors MP$_1$*, M$_2$*, MP$_3$*, MP$_4$*, and MP$_5$* provided the same functions and interconnections as NMOS transistors MN$_1$, MN$_2$, MN$_3$, MN$_4$, and MN$_5$, respectively, of amplifier 200.

While the present inventions have been particularly described with respect to the illustrated embodiments, it will be appreciated that various alterations, modifications and adaptations may be made based on the present disclosure, and are intended to be within the scope of the present inventions. While the inventions have been described in connection with what is presently considered to be the most practical and preferred embodiments, it is to be understood that the present inventions are not limited to the disclosed embodiments but, on the contrary, are intended to cover various modifications and equivalent arrangements included within the scope of the appended claims.

What is claimed is:

1. A memory device comprising:
   a first plurality of memory cells, each memory cell having a read-select input and a read output, each memory cell generating a current at its read output that is representative of a data value stored by the cell when the read-select input of the memory cell is activated, said current having a magnitude of substantially I$_{M1}$ to represent a first data state and a magnitude of substantially zero to represent a second data state;
   a second plurality of memory cells, each memory cell having a read-select input and a read output, each memory cell generating a current at its read output that is representative of a data value stored by the cell when the read-select input of the memory cell is activated, said current having a magnitude of substantially zero to represent the first data state and a magnitude of substantially I$_{M2}$ to represent the second data state;
   a first bit line coupled to the read outputs of the first plurality of memory cells;
   a second bit line coupled to the read outputs of the second plurality of memory cells;
   a first reference current circuit having an enable input and an output, the output being coupled to the second bit line, the first reference current circuit generating a first reference current I$_{R1}$ at its output when its enable input is activated, the first reference current I$_{R1}$ having a magnitude that is less than I$_{M1}$;
   a second reference current circuit having an enable input and an output, the output being coupled to the first bit line, the second reference current circuit generating a second reference current I$_{R2}$ at its output when its input is activated, the second reference current I$_{R2}$ having a magnitude that is less than I$_{M2}$;
   a current sense amplifier having a first input coupled to the first bit line, a second input coupled to the second bit line, and an output generating a signal representative of the difference in currents presented at the inputs of the differential current sense amplifier; and
   a read circuit to read the data states of the first and second plurality of memory cells, said read circuit providing an activation signal to the read-select input of only one of the first plurality or second plurality of memory cells at a time, said read circuit further providing an enable signal to the enable input of the first reference current circuit when said activation signal is provided to a memory cell of the first plurality of memory cells, and providing an enable signal to the enable input of the second reference current circuit when said activation signal is provided to a memory cell of the second plurality of memory cells.

2. The memory device of claim 1 wherein the read circuit comprises:
   a plurality of first read word lines, each first read word line being coupled to the read-select input of a respective one of the first plurality of memory cells;
   a plurality of second read word lines, each second read word line being coupled to the read-select input of a respective one of the second plurality of memory cells; and
   a read control/decoder that is responsive to a set of address bits and that has a plurality of control outputs, each first read word line being coupled to a respective one of the control outputs, each second read word line being coupled to a respective one of the control outputs, the enable input of the first reference current circuit being coupled to a respective one of the control outputs, and the enable input of the second reference current circuit being coupled to a respective one of the control outputs, said read control/decoder generating an activation signal to the first reference current circuit when it generates an activation signal to any one of the first read word lines, and further generating an activation signal to the second reference current circuit when it generates an activation signal to any one of the second read word lines.

3. The memory of claim 1, wherein the magnitude of current I$_{R1}$ generated by the first reference current circuit ranges between approximately 0.25·I$_{M1}$ and approximately 0.75·I$_{M2}$.

4. The memory of claim 3, wherein the magnitude of current I$_{R2}$ generated by the second reference current circuit ranges between approximately 0.25·I$_{M2}$ and approximately 0.75I$_{M2}$.

5. The memory of claim 1, wherein the magnitude of current I$_{R2}$ generated by the second reference current circuit ranges between approximately 0.25·I$_{M2}$ and approximately 0.75·I$_{M2}$.

6. The memory of claim 1, wherein the magnitude of current I$_{R1}$ generated by the first reference current circuit ranges between approximately 0.3·I$_{M1}$ and approximately 0.6·I$_{M1}$.

7. The memory of claim 1, wherein the magnitude of current I$_{R1}$ generated by the first reference current circuit ranges between approximately 0.35·I$_{M1}$ and approximately 0.45·I$_{M1}$.

8. The memory of claim 7, wherein the magnitude of current I$_{R2}$ generated by the second reference current circuit ranges between approximately 0.35·I$_{M2}$ and approximately 0.45·I$_{M2}$.

9. The memory of claim 1, wherein the magnitude of current I$_{R2}$ generated by the second reference current circuit ranges between approximately 0.35·I$_{M2}$ and approximately 0.45·I$_{M2}$.

10. The memory of claim 1, wherein the magnitude of current I$_{R1}$ generated by the first reference current circuit is equal to or less than approximately 0.5·I$_{M1}$.

11. The memory of claim 1, wherein each of the magnitudes of I$_{M1}$, I$_{M2}$, I$_{R1}$, and I$_{R2}$ is at least 100 times larger than the maximum expected leakage current on the bit line to which the current is coupled.

12. The memory of claim 1, wherein each of the magnitudes of I$_{M1}$, I$_{M2}$, I$_{R1}$, and I$_{R2}$ is at least 500 times larger than the maximum expected leakage current on the bit line to which the current is coupled.

13. The memory of claim 1, wherein each memory cell comprises a selection transistor coupled to its read output, wherein the selection transistor has a channel length of at least $1.2 \cdot L_{MIN}$, where $L_{MIN}$ is the minimum transistor channel length permitted for the transistor in the integrated-circuit technology used to construct the memory device.

14. The memory of claim 1, wherein each memory cell comprises a selection transistor coupled to its read output, wherein the selection transistor has a channel length of at least $1.5 \cdot L_{MIN}$, where $L_{MIN}$ is the minimum transistor channel length permitted for the transistor in the integrated-circuit technology used to construct the memory device.

15. The memory of claim 1, wherein each memory cell comprises a selection transistor coupled to its read output, wherein the selection transistor has a channel length of at least $[1.9 - Nw/160]L_{MIN}$, where $N_W$ is the number of word lines which are spanned by one of the bit lines, and where $L_{MIN}$ is the minimum transistor channel length permitted for the transistor in the integrated-circuit technology used to construct the memory device.

16. The memory of claim 1, wherein each memory cell comprises a selection transistor coupled to its read output, wherein the selection transistor has a W/L ratio of channel width to channel length, and wherein the W/L ratio is less than approximately $3.4 \cdot W_{MIN}/L_{MIN}$, where $W_{MIN}$ is the minimum transistor channel width permitted for the transistor in the integrated-circuit technology used to construct the memory device, and where $L_{MIN}$ is the minimum transistor channel length permitted for the transistor in the integrated-circuit technology used to construct the memory device.

17. The memory of claim 1, wherein each memory cell comprises a selection transistor coupled to its read output, wherein the selection transistor has a W/L ratio of channel width to channel length, and wherein the W/L ratio is less than approximately $1.7 \cdot W_{MIN}/L_{MIN}$, where $W_{MIN}$ is the minimum transistor channel width permitted for the transistor in the integrated-circuit technology used to construct the memory device, and where $L_{MIN}$ is the minimum transistor channel length permitted for the transistor in the integrated-circuit technology used to construct the memory device.

18. A method of reading data stored in a memory, the memory having a first plurality of memory cells and a second plurality of memory cells, each memory cell having a read-select input and a read output, each memory cell generating a current at its read output that is representative of a data value stored by the cell when the read-select input of the memory cell is activated, each memory cell of the first plurality of memory cells having its read output coupled to a first bit line and generating a current at its read output that has a magnitude less than or equal to a maximum magnitude $I_{M1}$, each memory cell of the second plurality of memory cells having its read output coupled to a second bit line and generating a current at its read output that has a magnitude less than or equal to a maximum magnitude $I_{M2}$, said method comprising the steps of:

(a) selecting a memory cell in one of the first and second plurality of memory cells by providing a signal to its read-select input such that the selected memory cell generates a current having a magnitude of substantially $I_{M1}$ to represent a first data state and a magnitude of substantially zero to represent a second data state when the selected memory cell is from the first plurality of memory cells, and such that the selected memory cell generates a current having a magnitude of substantially zero to represent the first data state and a magnitude of substantially $I_{M2}$ to represent the second data state when the selected memory cell is from the second plurality of memory cells;

(b) coupling a current $I_{R1}$ to the second bit line when step (a) selects a memory cell of the first plurality of memory cells, the magnitude of current $I_{R1}$ ranging between approximately $0.25 \cdot I_{M1}$ and approximately $0.75 \cdot I_{M1}$;

(c) coupling a current $I_{R2}$ to the first bit line when step (a) selects a memory cell of the second plurality of memory cells, the magnitude of current $I_{R2}$ ranging between approximately $0.25 \cdot I_{M2}$ and approximately $0.75 \cdot I_{M2}$; and (d) sensing a difference in the currents on the first and second bit lines with a current sense amplifier.

19. The method of claim 18, wherein each memory cell of the first plurality of memory cells generates a current having a magnitude of substantially $I_{M1}$ to represent a first data state and a current of substantially zero magnitude to represent a second data state, and wherein the magnitude of current $I_{R1}$ ranges between approximately $0.3 \cdot I_{M1}$ and approximately $0.6 \cdot I_{M1}$.

20. The method of claim 19, wherein each memory cell of the second plurality of memory cells generates a current having a magnitude of substantially $I_{M2}$ to represent a first data state and a current of substantially zero magnitude to represent a second data state, and wherein the magnitude of current $I_{R2}$ ranges between approximately $0.3 \cdot I_{M2}$ and approximately $0.6 \cdot I_{M2}$.

21. The method of claim 18, wherein each memory cell of the first plurality of memory cells generates a current having a magnitude of substantially $I_{M1}$ to represent a first data state and a current of substantially zero magnitude to represent a second data state, and wherein the magnitude of current $I_{R1}$ ranges between approximately $0.35 \cdot I_{M1}$ and approximately $0.45 \cdot I_{M1}$.

22. The method of claim 21, wherein each memory cell of the second plurality of memory cells generates a current having a magnitude of substantially $I_{M2}$ to represent a first data state and a current of substantially zero magnitude to represent a second data state, and wherein the magnitude of current $I_{R2}$ ranges between approximately $0.35 \cdot I_{M2}$ and approximately $0.45 \cdot I_{M2}$.

23. The method of claim 18, wherein each of the magnitudes of $I_{M1}$, $I_{M2}$, $I_{R1}$, and $I_{R2}$ is is at least 100 times larger than the maximum expected leakage current on the bit line to which the current is coupled.

24. The method of claim 18, wherein each of magnitudes of $I_{M1}$, $I_{M2}$, $I_{R1}$, and $I_{R2}$ is at least 500 times larger than the maximum expected leakage current on the bit line to which the current is coupled.

25. A memory device comprising:
a first plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M1}$;
a second plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M2}$;

a first bit line coupled to the read outputs of the first plurality of memory cells;

a second bit line coupled to the read outputs of the second plurality of memory cells;

a first reference current circuit having an enable input and an output, the output being coupled to the second bit line, the first reference current circuit generating a first reference current $I_{R1}$ at its output when its enable input is activated, the first reference current $I_{R1}$ having a magnitude that is less than $I_{M1}$;

a second reference current circuit having an enable input and an output, the output being coupled to the first bit line, the second reference current circuit generating a second reference current $I_{R2}$ at its output when its input is activated, the second reference current $I_{R2}$ having a magnitude that is less than $I_{M2}$; and a current sense amplifier having a first input coupled to the first bit line, a second input coupled to the second bit line, and an output generating a signal representative of the difference in currents presented at the inputs of the differential current sense amplifier; and wherein each memory cell of the first plurality of memory cells generates a current having a magnitude of substantially $I_{M1}$ to represent a first data state and a current of substantially zero magnitude to represent a second data state, and wherein the magnitude of current $I_{R1}$ generated by the first reference current circuit ranges between approximately $0.25 \cdot I_{M1}$ and approximately $0.75 \cdot I_{M1}$.

26. The memory of claim 25, wherein each memory cell of the first plurality of memory cells generates a current having a magnitude of substantially $I_{M1}$ to represent a first data state and a current of substantially zero magnitude to represent a second data state, and wherein the magnitude of current $I_{R1}$ generated by the first reference current circuit ranges between approximately $0.3 \cdot I_{M1}$ and approximately $0.6 \cdot I_{M1}$.

27. The memory of claim 25, wherein each memory cell of the first plurality of memory cells generates a current having a magnitude of substantially $I_{M1}$ to represent a first data state and a current of substantially zero magnitude to represent a second data state, and wherein the magnitude of current $I_{R1}$ generated by the first reference current circuit ranges between approximately $0.35 \cdot I_{M1}$ and approximately $0.45 \cdot I_{M1}$.

28. The memory of claim 28, wherein each memory cell of the second plurality of memory cells generates a current having a magnitude of substantially $I_{M2}$ to represent a first data state and a current of substantially zero magnitude to represent a second data state, and wherein the magnitude of current $I_{R2}$ generated by the second reference current circuit ranges between approximately $0.35 \cdot I_{M2}$ and approximately $0.45 \cdot I_{M2}$.

29. The memory of claim 25, wherein each of the magnitudes of $I_{M1}$, $I_{M2}$, $I_{R1}$, and $I_{R2}$ is at least 100 times larger than the maximum expected leakage current on the bit line to which the current is coupled.

30. The memory of claim 25, wherein each memory cell comprises a selection transistor coupled to its read output, wherein the selection transistor has a channel length of at least $1.2 \cdot L_{MIN}$, where $L_{MIN}$ is the minimum transistor channel length permitted for the transistor in the integrated-circuit technology used to construct the memory device.

31. The memory of claim 25, wherein each memory cell comprises a selection transistor coupled to its read output, wherein the selection transistor has a channel length of at least $[1.9-Nw/160] \cdot L_{MIN}$, where $N_w$ is the number of word lines which are spanned by one of the bit lines, and where $L_{MIN}$ is the minimum transistor channel length permitted for the transistor in the integrated-circuit technology used to construct the memory device.

32. The memory of claim 25, wherein each memory cell comprises a selection transistor coupled to its read output, wherein the selection transistor has W/L ratio of channel width to channel length, and wherein the W/L ratio is less than approximately $3.4 \cdot W_{MIN}/L_{MIN}$, where $W_{MIN}$ is the minimum transistor channel width permitted for the transistor in the integrated-circuit technology used to construct the memory device, and where $L_{MIN}$ is the minimum transistor channel length permitted for the transistor in the integrated-circuit technology used to construct the memory device.

33. A memory device comprising:

a first plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M1}$;

a second plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M2}$;

a first bit line coupled to the read outputs of the first plurality of memory cells;

a second bit line coupled to the read outputs of the second plurality of memory cells;

a first reference current circuit having an enable input and an output, the output being coupled to the second bit line, the first reference current circuit generating a first reference current $I_{R1}$ at its output when its enable input is activated, the first reference current $I_{R1}$ having a magnitude that is less than $I_{M1}$;

a second reference current circuit having an enable input and an output, the output being coupled to the first bit line, the second reference current circuit generating a second reference current $I_{R2}$ at its output when its input is activated, the second reference current $I_{R2}$ having a magnitude that is less than $I_{M2}$; and a current sense amplifier having a first input coupled to the first bit line, a second input coupled to the second bit line, and an output generating a signal representative of the difference in currents presented at the inputs of the differential current sense amplifier; and wherein each of the magnitudes of $I_{M1}$, $I_{M2}$, $I_{R1}$, and $I_{R2}$ is at least 100 times larger than the maximum expected leakage current on the bit line to which the current is coupled.

34. The memory of claim 33, wherein each of magnitudes of $I_{M1}$, $I_{M2}$, $I_{R1}$, and $I_{R2}$ is at least 500 times larger than the maximum expected leakage current on the bit line to which the current is coupled.

35. The memory of claim 33, wherein each memory cell comprises a selection transistor coupled to its read output, wherein the selection transistor has a channel length of at least $1.2 \cdot L_{MIN}$, where $L_{MIN}$ is the minimum transistor channel length permitted for the transistor in the integrated-circuit technology used to construct the memory device.

36. A memory device comprising:

a first plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M1}$;

a second plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M2}$;

a first bit line coupled to the read outputs of the first plurality of memory cells;

a second bit line coupled to the read outputs of the second plurality of memory cells;

a first reference current circuit having an enable input and an output, the output being coupled to the second bit line, the first reference current circuit generating a first reference current $I_{R1}$ at its output when its enable input is activated, the first reference current $I_{R1}$ having a magnitude that is less than $I_{M1}$;

a second reference current circuit having an enable input and an output, the output being coupled to the first bit line, the second reference current circuit generating a second reference current $I_{R2}$ at its output when its input is activated, the second reference current $I_{R2}$ having a magnitude that is less than $I_{M2}$; and a current sense amplifier having a first input coupled to the first bit line, a second input coupled to the second bit line, and an output generating a signal representative of the difference in currents presented at the inputs of the differential current sense amplifier; and wherein each memory cell comprises a selection transistor coupled to its read output, wherein the selection transistor has a channel length of at least $1.2 \cdot L_{MIN}$, where $L_{MIN}$ is the minimum transistor channel length permitted for the transistor in the integrated-circuit technology used to construct the memory device.

37. The memory of claim 36, wherein the selection transistor has a channel length of at least $1.5 \cdot L_{MIN}$.

38. A memory device comprising:

a first plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M1}$;

a second plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M2}$;

a first bit line coupled to the read outputs of the first plurality of memory cells;

a second bit line coupled to the read outputs of the second plurality of memory cells;

a first reference current circuit having an enable input and an output, the output being coupled to the second bit line, the first reference current circuit generating a first reference current $I_{R1}$ at its output when its enable input is activated, the first reference current $I_{R1}$ having a magnitude that is less than $I_{M1}$;

a second reference current circuit having an enable input and an output, the output being coupled to the first bit line, the second reference current circuit generating a second reference current $I_{R2}$ at its output when its input is activated, the second reference current $I_{R2}$ having a magnitude that is less than $I_{M2}$; and a current sense amplifier having a first input coupled to the first bit line, a second input coupled to the second bit line, and an output generating a signal representative of the difference in currents presented at the inputs of the differential current sense amplifier; and wherein each memory cell comprises a selection transistor coupled to its read output, wherein the selection transistor has a channel length of at least $[1.9-N_W/160] \cdot L_{MIN}$, where $N_W$ is the number of word lines which are spanned by one of the bit lines, and where $L_{MIN}$ is the minimum transistor channel length permitted for the transistor in the integrated-circuit technology used to construct the memory device.

39. A memory device comprising:

a first plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M1}$;

a second plurality of memory cells, each memory cell having a read-select input and a read output, each memory cell generating a current at its read output that is representative of a data value stored by the cell when the read-select input of the memory cell is activated, the current being less than or equal to a maximum magnitude $I_{M2}$;

a first bit line coupled to the read outputs of the first plurality of memory cells;

a second bit line coupled to the read outputs of the second plurality of memory cells;

a first reference current circuit having an enable input and an output, the output being coupled to the second bit line, the first reference current circuit generating a first reference current $I_{R1}$ at its output when its enable input is activated, the first reference current $I_{R1}$ having a magnitude that is less than $I_{M1}$;

a second reference current circuit having an enable input and an output, the output being coupled to the first bit line, the second reference current circuit generating a second reference current $I_{R2}$ at its output when its input is activated, the second reference current $I_{R2}$ having a magnitude that is less than $I_{M2}$; and a current sense amplifier having a first input coupled to the first bit line, a second input coupled to the second bit line, and an output generating a signal representative of the difference in currents presented at the inputs of the differential current sense amplifier; and wherein each memory cell comprises a selection transistor coupled to its read output, wherein the selection transistor has W/L ratio of channel width to channel length, and wherein the W/L ratio is less than approximately $3.4 \cdot W_{MIN}/L_{MIN}$, where $W_{MIN}$ is the minimum transistor channel width permitted for the transistor in the integrated-circuit technology used to construct the memory device, and where $L_{MIN}$ is the minimum transistor channel length permitted for the transistor in the integrated-circuit technology used to construct the memory device.

40. The memory of claim 39, wherein each memory cell comprises a selection transistor coupled to its read output, wherein the selection transistor has W/L ratio of channel width to channel length, and wherein the W/L ratio is less than approximately $1.7 \cdot W_{MIN}/L_{MIN}$, where $W_{MIN}$ is the minimum transistor channel width permitted for the transistor in the integrated-circuit technology used to construct the memory device, and where $L_{MIN}$ is the minimum transistor channel length permitted for the transistor in the integrated-circuit technology used to construct the memory device.

* * * * *

UNITED STATES PATENT AND TRADEMARK OFFICE
CERTIFICATE OF CORRECTION

PATENT NO. : 7,075,842 B2  Page 1 of 1
APPLICATION NO. : 10/779464
DATED : July 11, 2006
INVENTOR(S) : Tzartzanis et al.

It is certified that error appears in the above-identified patent and that said Letters Patent is hereby corrected as shown below:

At column 18, line 32, "M2" should be -- M1 --.

At column 21, line 46, "28" should be -- 25 --.

Signed and Sealed this

Fifth Day of September, 2006

JON W. DUDAS
*Director of the United States Patent and Trademark Office*